(12) United States Patent
Treger et al.

(10) Patent No.: US 11,888,019 B2
(45) Date of Patent: Jan. 30, 2024

(54) FERROELECTRIC DEVICES

(71) Applicant: Micron Technology, Inc., Boise, ID (US)

(72) Inventors: Mikhail A. Treger, Boise, ID (US); Albert Liao, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 17/125,826

(22) Filed: Dec. 17, 2020

(65) Prior Publication Data

US 2022/0199757 A1 Jun. 23, 2022

(51) Int. Cl.
*H01L 21/00* (2006.01)
*H01L 49/02* (2006.01)
*H10B 53/30* (2023.01)
*H10B 53/40* (2023.01)

(52) U.S. Cl.
CPC ............ *H01L 28/60* (2013.01); *H10B 53/30* (2023.02); *H10B 53/40* (2023.02)

(58) Field of Classification Search
CPC ............... H01L 28/60; H01L 27/11507; H01L 27/11509
See application file for complete search history.

(56) References Cited

U.S. PATENT DOCUMENTS

| 6,914,800 | B2 | 7/2005 | Ahn et al. | |
| 10,403,815 | B2 * | 9/2019 | Ino | H10N 70/841 |
| 2018/0166448 | A1 * | 6/2018 | Cheng | H01L 28/40 |
| 2018/0233573 | A1 | 8/2018 | Lin et al. | |
| 2018/0286987 | A1 | 10/2018 | Lee et al. | |
| 2019/0066917 | A1 * | 2/2019 | Nahar | H01G 4/30 |

(Continued)

FOREIGN PATENT DOCUMENTS

WO   WO   3/2022
PCT/US2021/060610

OTHER PUBLICATIONS

Hu et al., "Low leakage current and enhanced ferroelectric properties of Ti and Zn codoped BiFeO3 thin film", Applied Physics Letters, 92 192905 (2008).*

(Continued)

*Primary Examiner* — Richard A Booth
(74) *Attorney, Agent, or Firm* — Wells St. John P.S.

(57) ABSTRACT

Some embodiments include a ferroelectric device having a ferroelectric insulative material which includes zinc. Some embodiments include a capacitor having a ferroelectric insulative material between a first electrode and a second electrode. The ferroelectric insulative material includes one or more metal-oxide-containing layers and one or more zinc-containing layers. Some embodiments include a memory array having a first set of first conductive structures and a second set of second conductive structures. The first conductive structures are coupled with driver circuitry, and the second conductive structures are coupled with sensing circuitry. The memory array includes an array of access devices. Each of the access devices is uniquely addressed by one of the first conductive structures in combination with one of the second conductive structures. Ferroelectric capacitors are coupled with the access devices. Each of the ferroelectric capacitors includes ferroelectric insulative material having zinc.

28 Claims, 3 Drawing Sheets

(56) References Cited

U.S. PATENT DOCUMENTS

2019/0074295 A1  3/2019  Schroder
2020/0194443 A1  6/2020  Lin et al.

OTHER PUBLICATIONS

Byun et al., "Tailoring the Interface Quality Between HfO2 and GaAs via in Situ ZnO Passivation Using Atomic Layer Deposition", ACS Applied Materials & Interfaces, 2014, United States, pp. 10482-10488.

Lin et al., "Nonvolatile Memories with Dual-Layer Nanocrystalline ZnO Embedded Zr-Doped HfO2 High-k Dielectric", Electrochemical and Solid-State Letters 13, 2010, United States, pp. H83-H86.

Lu et al., "Nanocrystalline Zinc-Oxide-Embedded Zirconium-Doped Hafnium Oxide for Nonvolatile Memories", Journal of the Electrochemical Society 155, 2008, United States, pp. H386-H389.

Lu et al., "Nonvolatile Memories Based on Nanocrystalline Zinc Oxide Embedded Zirconium-Doped Hafnium Oxide Thin Films", ECS Transactions 11(4), 2007, United States, pp. 509-518.

\* cited by examiner

US 11,888,019 B2

FERROELECTRIC DEVICES

TECHNICAL FIELD

Ferroelectric devices, such as, for example, ferroelectric capacitors. Memory arrays comprising ferroelectric devices.

BACKGROUND

Capacitors are electrical components that may be used in integrated circuitry. A capacitor may have electrically insulating material between a pair of conductive structures. Energy as an electric field may be electrostatically stored within the insulating material.

A ferroelectric capacitor has ferroelectric material as at least part of the insulating material. Ferroelectric materials are characterized by having two stable polarized states. The polarization state of the ferroelectric material may be changed by application of suitable programming voltage, and remains after removal of the programming voltage (at least for a time).

In some applications, capacitors may be utilized in memory/storage. For instance, ferroelectric capacitors may be incorporated into ferroelectric random access memory (FeRAM).

FeRAM may have many attractive features, including nonvolatility, low power consumption, high-speed operation, etc. However, difficulties are encountered in fabricating highly-integrated memory comprising FeRAM. It is desired to develop new capacitors suitable for utilization in FeRAM, and new methods of fabricating FeRAM.

Ferroelectric materials may be utilized in other assemblies besides capacitors. For instance, ferroelectric materials may be utilized in ferroelectric field effect transistors (FeFETs) and ferroelectric tunnel junction (FTJ) devices. It is desired to develop improvements which may be utilized across a broad range of ferroelectric assemblies, including, for example, ferroelectric capacitors, FeFETs and FTJ devices.

DETAILED DESCRIPTION OF THE ILLUSTRATED EMBODIMENTS

Some aspects include ferroelectric devices (e.g., ferroelectric capacitors) having ferroelectric material which includes zinc. The zinc may advantageously enhance remnant polarization (2Pr) as compared to comparable ferroelectric devices lacking the zinc, may advantageously improve thermal stability, etc. Example embodiments are described with reference to FIGS. 1-6.

Figure 1:
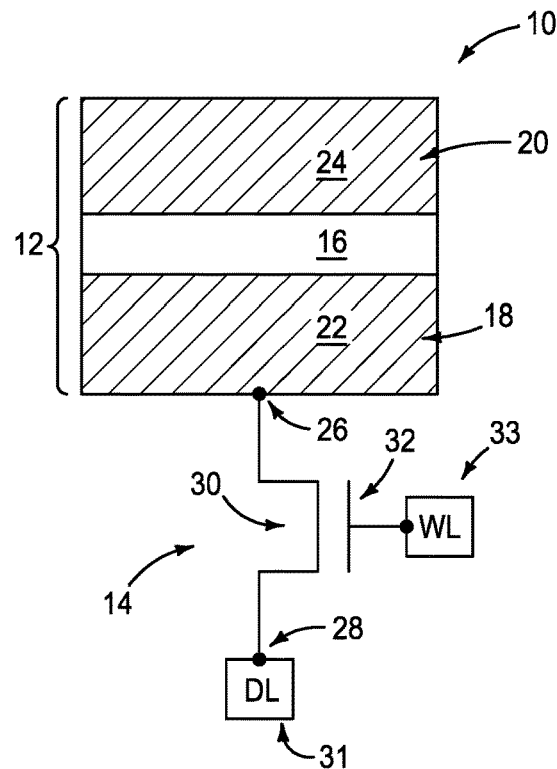
FIGS. 1 and 2 are diagrammatic cross-sectional side views of example ferroelectric devices integrated into example assemblies.

Referring to FIG. 1, an integrated assembly 10 comprises a ferroelectric capacitor 12 coupled to an access device 14.

The example access device 14 is schematically illustrated to be a transistor, but may be any suitable device (e.g., a diode, ovonic switch, etc.).

The capacitor 12 and access device 14 may be supported by a base (not shown). Such base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The capacitor 12 includes a ferroelectric insulative material 16 between a pair of conductive electrodes 18 and 20.

The electrodes 18 and 20 may be referred to as a first electrode and a second electrode, respectively. The first electrode 18 is coupled with the access device 14.

The electrodes 18 and 20 may have any suitable thicknesses, and in some embodiments may have thicknesses within a range of from about 5 nanometers (nm) to about 50 nm.

The electrodes 18 and 20 comprise conductive electrode materials 22 and 24, respectively. The electrode materials 22 and 24 may comprise any suitable electrically conductive composition(s); such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The electrode materials 22 and 24 may be the same composition as one another, or may be different compositions relative to one another. In some embodiments, the electrode materials 22 and 24 may both comprise, consist essentially of, or consist of titanium nitride.

The ferroelectric insulative material 16 may comprise any suitable composition(s); and in some example embodiments may include one or more of transition metal oxide, zirconium, zirconium oxide, niobium, niobium oxide, hafnium and hafnium oxide. Also, in some example embodiments the ferroelectric insulative material may have dopant therein which comprises one or more of silicon, aluminum, lanthanum, yttrium, erbium, calcium, magnesium, strontium, and a rare-earth element. The ferroelectric insulative material 16 also comprises zinc.

The zinc (Zn) may be present to any suitable concentration within the ferroelectric insulative material 16. In some embodiments, the zinc is present to concentration of less than or equal to about 15 atomic percent (at %), to a concentration of less than or equal to about 10 at %, to concentration of less than or equal to about 5 at %, to a concentration of less than or equal to about 1 at %, to a concentration of less than or equal to about 0.1 at %, etc. In some embodiments, the zinc may be present to a concentration within a range of from greater than or equal to about 0.01 at % to less than or equal to about 0.1 at %.

The zinc may be present in any suitable composition(s). For instance, in some embodiments the zinc may be present in combination with one or both of oxygen and silicon. In other words, the zinc may be present as one or more of ZnO, ZnSi and ZnSiO, where the chemical formulas indicate primary constituents rather than specific stoichiometries. In some embodiments the ZnO may correspond to stoichiometric zinc oxide (i.e., may correspond specifically to ZnO), and in some embodiments the ZnSi may correspond to stoichiometric zinc silicide (i.e., may correspond specifically to ZnSi). In other embodiments, the ZnO may be non-stoichiometric zinc oxide (i.e., may correspond to $ZnO_x$, where x is a number other than 1), and/or the ZnSi may be nonstoichiometric zinc silicide (i.e., may correspond to $ZnSi_x$, where x is a number other than 1).

In some embodiments, the ferroelectric insulative material 16 may comprise, consist essentially of, or consist of a zinc-containing dopant dispersed within a metal-oxide-containing matrix. In some embodiments, the metal-oxide-containing matrix may comprise, consist essentially of, or consist of one or both of zirconium oxide and hafnium oxide. The concentration of zirconium oxide and/or hafnium oxide may be from 0 at % to 100 at % within such matrix.

The ferroelectric insulative material 16 may be formed to any suitable thickness. In some embodiments, the ferroelectric insulative material 16 may have a thickness within a range of from about 20 angstroms (Å) to about 1000 Å (i.e., 100 nm).

The zinc within the ferroelectric insulative material 16 may improve properties of the material 16 relative to similar materials lacking the zinc. For instance, the zinc may increase the remnant polarization (2Pr) within the ferroelectric material, and in some embodiments may increase such remnant polarization by at least about 10%, at least about 20%, etc., relative to similar material lacking the zinc. The increased remnant polarization may improve performance of ferroelectric capacitors in memory-storage applications. For instance, the increased remnant polarization may lead to higher signal-to-noise during the detection of a memory state of a FeRAM cell.

The zinc within the ferroelectric insulative material 16 may also improve performance of the material in high-temperature environments (e.g., environments having a temperature in excess of 300° C., environments having a temperature in excess of 500° C., etc.). In some embodiments, the zinc-containing ferroelectric insulative material may be more resistant to thermally-induced switching from a ferroelectric phase to a non-ferroelectric phase as compared to a similar ferroelectric insulative material lacking the zinc.

In some embodiments, the zinc may advantageously increase the relative proportion of an orthorhombic crystalline phase to a monoclinic crystalline phase within the ferroelectric insulative material 16, which may be at least in part responsible for the enhanced remnant polarization.

A problem which may be expected to be encountered when incorporating metal-containing dopants (e.g., zinc) into ferroelectric insulative material is that electrical leakage across the ferroelectric insulative material will increase, and will become detrimental to device performance. However, the inventors have found that zinc may be incorporated within ferroelectric insulative material while still keeping leakage through the ferroelectric insulative material within reasonable tolerances; and, in some applications, while keeping leakage characteristics of the ferroelectric insulative material substantially the same as leakage characteristics of comparable ferroelectric insulative material lacking the zinc.

The access device 14 of FIG. 1 is schematically illustrated as being a transistor. The transistor has a first source/drain region 26 coupled with the lower electrode 18 of the capacitor 12, has a second source/drain region 28 coupled with a digit line 31 (DL), and has a channel region 30 between the source/drain regions 26 and 28. The transistor further has a gate 32 operatively proximate to the channel region 30, with the gate 32 being coupled with a wordline 33 (WL). The illustrated transistor 14 has a vertically-extending channel region 30. In other embodiments, the transistor may have other orientations.

The capacitor 12 of FIG. 1 is an example configuration of a ferroelectric capacitor. In other embodiments, the ferroelectric capacitor may have a different configuration. For instance, FIG. 2 shows an example capacitor 12 which is configured to have a bottom electrode 18 configured as an upwardly-opening container-shape, and to have a region of the ferroelectric insulative material 16 and a region of the upper electrode 20 extending into the container-shape of the bottom electrode 18.

Figure 2:
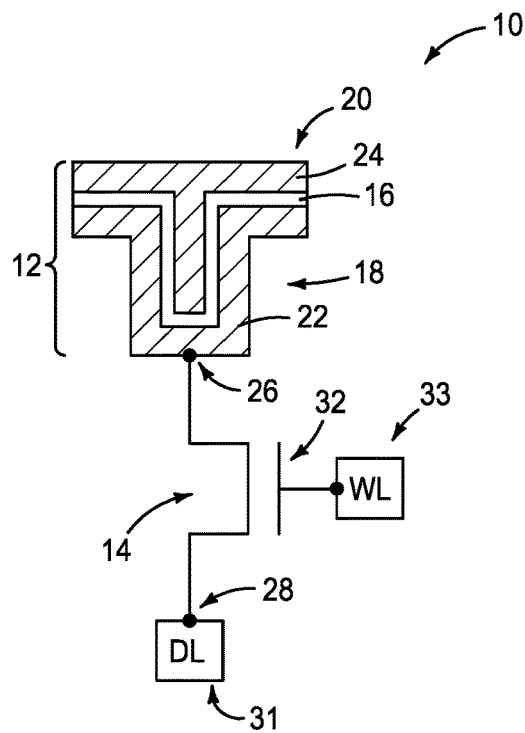

The example capacitor of FIG. 1 may be considered to be an example of a planar capacitor (i.e., to have a planar bottom electrode), and the example capacitor of FIG. 2 may be considered to be an example of a container-type configuration (i.e., to have a container-shaped bottom electrode). In other embodiments, capacitors comprising zinc-containing ferroelectric insulative material may have other configurations. For instance, they may have pillar-type configurations (i.e., may have pillar-shaped bottom electrodes).

Figure 3:
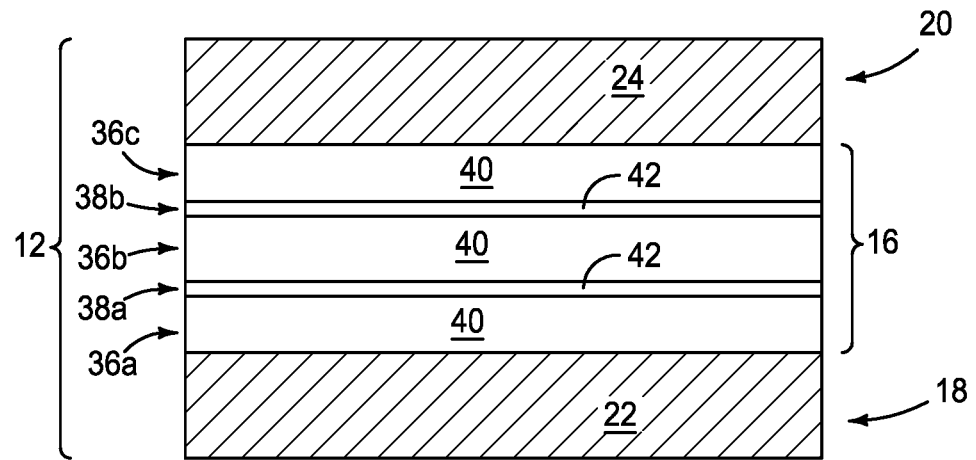
FIGS. 3 and 4 are diagrammatic cross-sectional side views of regions of example ferroelectric devices.
Figure 4:
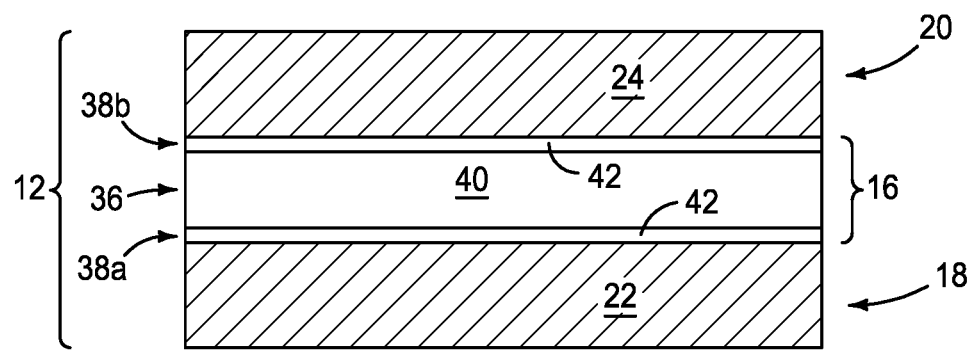
Figure 5:
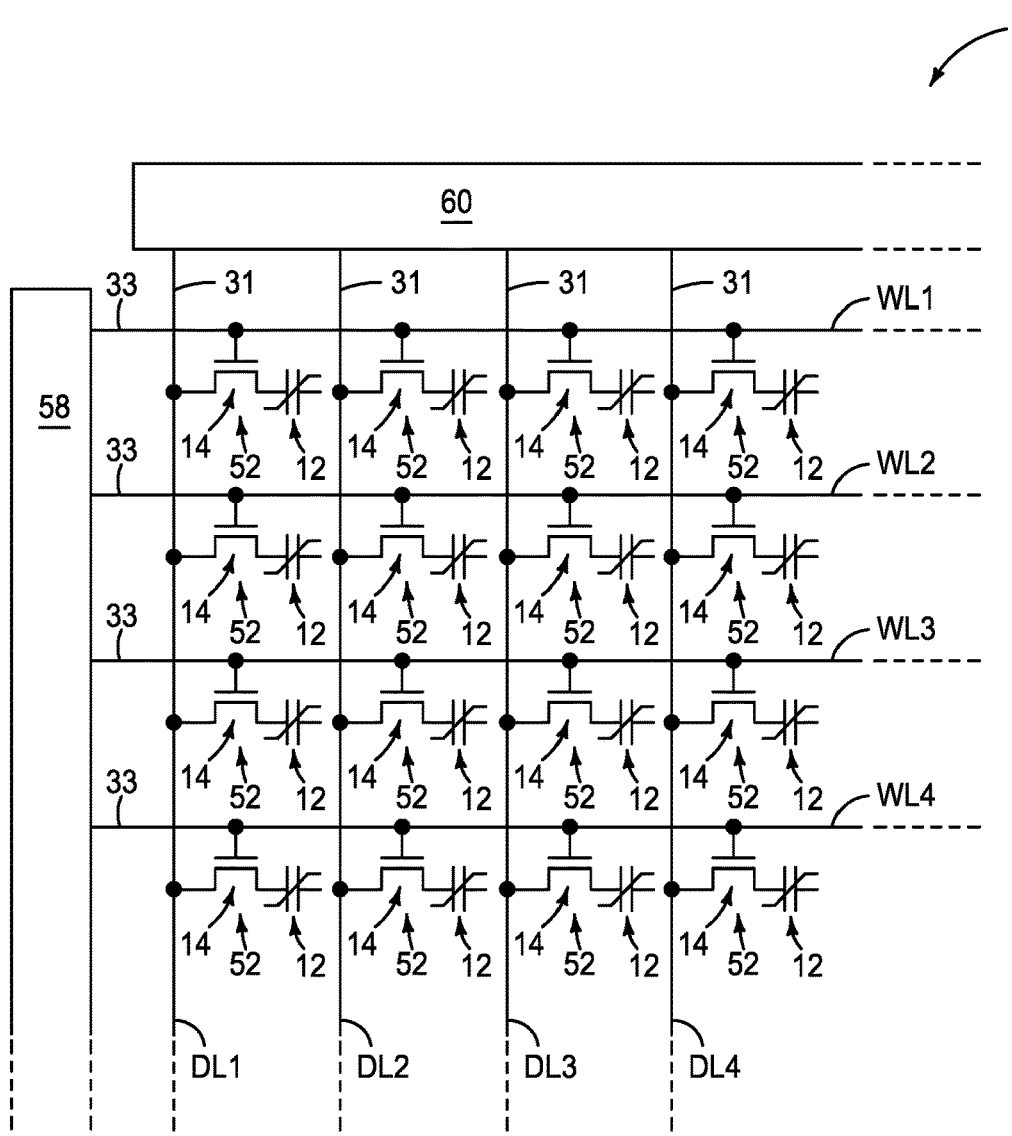
FIG. 5 is a schematic diagram of an example memory array comprising example ferroelectric devices.
Figure 6:
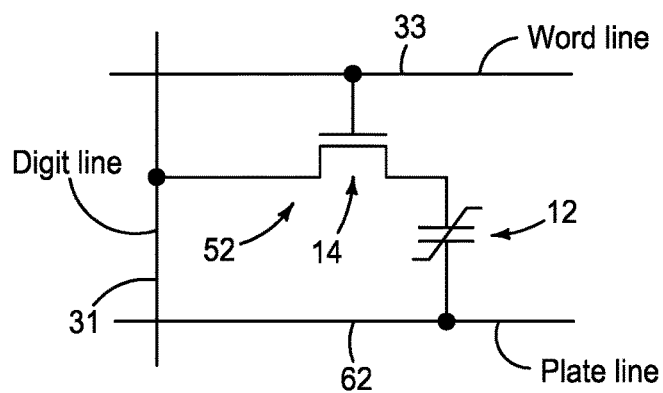
FIG. 6 is a schematic diagram of a region of an example integrated assembly having an example memory cell comprising a ferroelectric capacitor.

The embodiments of FIGS. 1 and 2 show the ferroelectric insulative material 16 as a homogeneous material, or at least as a substantially homogeneous material (with the term "substantially homogeneous" meaning homogeneous to within reasonable tolerances of fabrication and measurement). In other embodiments, the ferroelectric insulative material may not be homogeneous, or at least may not be substantially homogeneous. For instance, the ferroelectric insulative material may comprise a laminate of two or more layers having different compositions relative to one another. FIGS. 3 and 4 show portions of capacitors 12 in accordance with example embodiments in which the ferroelectric insulative material 16 comprises laminates of two or more layers.

Referring to FIG. 3, the illustrated capacitor 12 includes the ferroelectric insulative material 16 between the first electrode 18 and the second electrode 20. The material 16 includes metal-oxide-containing layers 36a, 36b and 36c, and includes zinc-containing layers 38a and 38b.

The metal-oxide-containing layers 36a, 36b and 36c may all comprise a same composition as one another, or may comprise different compositions relative to one another. In the illustrated embodiment, the layers 36a, 36b and 36c all comprise the composition 40. Such composition may include, for example, one or more of transition metal oxide, zirconium, zirconium oxide, niobium, niobium oxide, hafnium and hafnium oxide. In some embodiments, the composition 40 may comprise one or both of hafnium oxide and zirconium oxide.

The zinc-containing layers 38a and 38b may comprise the same composition as one another, or may comprise different compositions relative to one another. In the illustrated embodiment, the zinc-containing layers 38a and 38b both comprise the composition 42. The composition 42 may comprise zinc in combination with one or both of oxygen and silicon. For instance, the composition 42 may comprise one or more of ZnO, ZnSi and ZnSiO, where the chemical formulas indicate primary constituents rather than specific stoichiometries.

The composition 42 and/or the composition 40 may further include dopant comprising one or more of silicon, aluminum, lanthanum, yttrium, erbium, calcium, magnesium, strontium, and a rare-earth element.

The zinc-containing layers 38a and 38b are shown to be much thinner than the metal-oxide-containing layers 36a, 36b and 36c. In some embodiments, each of the metaloxide-containing layers is at least about 5-times (5×) thicker than each of the zinc-containing layers. In some embodiments, at least one of the metal-oxide-containing layers is at least about 5× thicker than at least one of the zinc-containing layers. In some embodiments, each of the metal-oxide-containing layers is at least about 10-times (10×) thicker than each of the zinc-containing layers. In some embodiments, at least one of the metal-oxide-containing layers is at least about 10× thicker than at least one of the zinc-containing layers. In some embodiments, each of the zinc-containing layers has a thickness within a range of from about 1 monolayer to about 7 monolayers, and each of the metal-oxide-containing layers has a thickness within a range of from about 1 nm to about 100 nm.

Although the illustrated embodiment of FIG. 3 shows three of the metal-oxide-containing layers 36 and two of the zinc-containing layers 38, it is to be understood that the ferroelectric insulative material 16 may comprise any suitable number of the metal-oxide-containing layers 36 and any suitable number of the zinc-containing layers 38. In some embodiments, the material 16 may be considered to comprise one or more of the metal-oxide-containing layers 36 and one or more of the zinc-containing layers 38.

In the illustrated embodiment of FIG. 3, the metal-oxide-containing layers 36a and 36c are directly against the electrodes 18 and 20, respectively, and the zinc-containing layers 38a and 38b are not directly against the electrodes. In contrast, FIG. 4 shows an embodiment in which the zinc-containing layers 38a and 38b are directly against the electrodes 18 and 20, respectively, and in which a metal-oxide-containing layer 36 is not directly against the electrodes.

The ferroelectric insulative material 16 of FIGS. 1-4 may be formed with any suitable processing, including, for example, one or more of atomic layer deposition (ALD), chemical vapor deposition (CVD) and physical vapor deposition (PVD).

Although the embodiments of FIGS. 1-4 show the ferroelectric devices 12 configured as capacitors, it is to be understood that in other embodiments ferroelectric devices comprising the zinc-containing ferroelectric insulative materials described herein may be configured as transistors (FeFETs) ferroelectric tunnel junction device (FTJ devices), etc.

In some embodiments, the ferroelectric capacitors 12 may be incorporated into memory arrays. An example memory array 50 is described with reference to FIG. 5. The memory array includes an array of substantially identical access devices 14, and includes a plurality of substantially identical ferroelectric capacitors 12 coupled with the access devices. The term "substantially identical" means identical to within reasonable tolerances of fabrication and measurement.

A first set of first conductive structures 33 extends along rows of the memory array, and a second set of second conductive structures 31 extends along columns of the memory array. The first conductive structures 33 are indicated to be wordlines, with such wordlines being labeled as WL1-WL4 within the illustrated region of the memory array 50. The second conductive structures 31 are indicated to be digit lines, with such digit lines being labeled as DL1-DL4 within the illustrated region of the memory 50.

Each of the access devices 14 is uniquely addressed utilizing a combination of a wordline 33 and a digit line 31. In some embodiments, the capacitors 12 and access devices 14 may be considered together to form memory cells 52, and each of such memory cells may be considered to be addressed utilizing a unique combination of a wordline 33 and a digit line 31.

In the illustrated embodiment, the wordlines 33 extend to driver circuitry 58, and the digit lines 31 extend to sensing (detecting) circuitry 60 (e.g., sense-amplifier-circuitry). In some applications, the memory array 50 may be configured as ferroelectric random access memory (FeRAM).

FIG. 9 diagrammatically illustrates one of the memory cells 52, and shows that one of the electrodes of the ferroelectric capacitor 12 may be coupled with a plate line 62. The plate line 62 of FIG. 9 may be utilized in combination with the illustrated wordline 33 for controlling an operational state of the illustrated ferroelectric capacitor 12.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include a ferroelectric device having a ferroelectric insulative material which includes zinc.

Some embodiments include a capacitor having a ferroelectric insulative material between a first electrode and a second electrode. The ferroelectric insulative material includes one or more metal-oxide-containing layers and one or more zinc-containing layers.

Some embodiments include a memory array having a first set of first conductive structures and a second set of second conductive structures. The first conductive structures are coupled with driver circuitry, and the second conductive structures are coupled with sensing circuitry. The memory array includes an array of access devices. Each of the access devices is uniquely addressed by one of the first conductive structures in combination with one of the second conductive structures. Ferroelectric capacitors are coupled with the access devices. Each of the ferroelectric capacitors includes ferroelectric insulative material having zinc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A ferroelectric device comprising a ferroelectric insulative material consisting of one or members of the group consisting of a non-iron, non-hafnium transition metal oxide, zirconium, zirconium oxide, niobium, and niobium oxide, and one or more members of the group consisting of ZnSiO, ZnO and ZnSi, wherein the zinc is present at a concentration of less than or equal to 15 at %.

2. The ferroelectric device of claim 1 configured as a capacitor.

3. The ferroelectric device of claim 1 wherein the ferroelectric insulative material is substantially homogeneous.

4. The ferroelectric device of claim 1 wherein the ferroelectric insulative material is not substantially homogeneous.

5. The ferroelectric device of claim 4 wherein the ferroelectric insulative material is configured as a laminate of two or more distinct layers having different compositions relative to one another.

6. The ferroelectric device of claim 1 wherein the zinc is present to a concentration of less than or equal to about 10 at %.

7. The ferroelectric device of claim 1 wherein the zinc is present to a concentration of less than or equal to about 5 at %.

8. The ferroelectric device of claim 1 wherein the zinc is present to a concentration of less than or equal to about 1 at %.

9. The ferroelectric device of claim 1 wherein the zinc is present to a concentration of less than or equal to about 0.1 at %.

10. The ferroelectric device of claim 1 wherein the zinc is present to a concentration within a range of from greater than or equal to about 0.01 at % to less than or equal to about 0.1 at %.

11. The ferroelectric device of claim 1 wherein the ferroelectric insulative material includes an orthorhombic crystalline phase.

12. The ferroelectric device of claim 1 wherein the ferroelectric insulative material is more resistant to thermally-induced switching from a ferroelectric phase to a non-ferroelectric phase than is a comparable ferroelectric insulative material lacking the zinc.

13. The ferroelectric device of claim 1 wherein the ferroelectric insulative material has substantially the same leakage characteristics as a comparable ferroelectric insulative material lacking the zinc.

14. A capacitor, comprising:
ferroelectric insulative material between a first electrode and a second electrode; and
wherein the ferroelectric insulative material includes one or more metal-oxide-containing layers and at least one zinc-containing layer, the zinc-containing layer being distinct from the one or more metal oxide layers and consisting of one or more members of the group consisting of a non-iron transition metal oxide, zirconium, zirconium oxide, niobium, and niobium oxide, and one or more members of the group consisting of ZnO, ZnSiO and ZnSi, wherein having zinc is present to a concentration of less than or equal to 15 at %.

15. The capacitor of claim 14 wherein at least one of the one or more metal-oxide-containing layers is at least about 5-times thicker than at least one of the one or more zinc-containing layers.

16. The capacitor of claim 14 wherein at least one of the one or more metal-oxide-containing layers is at least about 10-times thicker than at least one of the one or more zinc-containing layers.

17. The capacitor of claim 14 wherein the one or more zinc-containing layers each has a thickness within a range of from about 1 monolayer to about 7 monolayers.

18. The capacitor of claim 17 wherein the one or more metal-oxide-containing layers each has a thickness within a range of from about 1 nm to about 100 nm.

19. The capacitor of claim 14 wherein the one or more zinc-containing layers comprise the zinc in combination with one or both of oxygen and silicon.

20. The capacitor of claim 14 wherein at least one of the one or more zinc-containing layers comprises ZnO, where the chemical formula indicates primary constituents rather than a specific stoichiometry.

21. The capacitor of claim 14 wherein at least one of the one or more zinc-containing layers comprises ZnSi, where the chemical formula indicates primary constituents rather than a specific stoichiometry.

22. The capacitor of claim 14 wherein the one or more metal-oxide-containing layers comprise one or both of hafnium oxide and zirconium oxide.

23. The capacitor of claim 14 wherein one of the one or more zinc-containing layers is directly against one of the first and second electrodes.

24. The capacitor of claim 14 wherein one of the one or more metal-oxide-containing layers is directly against one of the first and second electrodes.

25. A memory array, comprising:
a first set of first conductive structures, the first conductive structures being coupled with driver circuitry;
a second set of second conductive structures, the second conductive structures being coupled with sensing circuitry;
an array of access devices, each of the access devices being uniquely addressed by one of the first conductive structures in combination with one of the second conductive structures; and
ferroelectric capacitors coupled with the access devices; each of the ferroelectric capacitors including a ferroelectric insulative material which consists of one or more members of the group consisting of a non-iron, non-hafnium transition metal oxide, zirconium, zirconium oxide, niobium, and niobium oxide, and one or more members of the group consisting of ZnO, ZnSiO and ZnSi, wherein zinc is present at a concentration less than or equal to 15 at %.

26. The memory array of claim 25 wherein the zinc is present to a concentration within a range of from greater than or equal to about 0.01 at % to less than or equal to about 0.1 at %.

27. The memory array of claim 25 wherein the access devices are transistors.

28. The memory array of claim 25 wherein the first conductive structures are wordlines and the second conductive structures are digit lines.

\* \* \* \* \*